US007487474B2

(12) United States Patent
Ciplickas et al.

(10) Patent No.: US 7,487,474 B2
(45) Date of Patent: Feb. 3, 2009

(54) DESIGNING AN INTEGRATED CIRCUIT TO IMPROVE YIELD USING A VARIANT DESIGN ELEMENT

(75) Inventors: Dennis Ciplickas, San Jose, CA (US); Joe Davis, Unterschleissheim (DE); Christopher Hess, San Ramon, CA (US); Sherry Lee, San Jose, CA (US); Enrico Malavasi, Mountain View, CA (US); Abdulmobeen Mohammad, Sunnyvale, CA (US); Ratibor Radojcic, San Diego, CA (US); Brian Stine, Los Altos Hills, CA (US); Rakesh Vallishayee, San Jose, CA (US); Stefano Zanella, San Jose, CA (US); Nicola Dragone, Vobarno (IT); Carlo Guardiani, Verona (IT); Michel Quarantelli, Noceto (IT); Stefano Tonello, Breganze (IT); Joshi Aniruddha, Irvine, CA (US)

(73) Assignee: PDF Solutions, Inc., San Jose, CA (US)

( * ) Notice: Subject to any disclaimer, the term of this patent is extended or adjusted under 35 U.S.C. 154(b) by 505 days.

(21) Appl. No.: 10/541,076

(22) PCT Filed: Nov. 17, 2003

(86) PCT No.: PCT/US03/37046
§ 371 (c)(1),
(2), (4) Date: Jun. 29, 2005

(87) PCT Pub. No.: WO2004/061898
PCT Pub. Date: Jul. 22, 2004

(65) Prior Publication Data
US 2006/0101355 A1 May 11, 2006

Related U.S. Application Data

(60) Provisional application No. 60/437,922, filed on Jan. 2, 2003.

(51) Int. Cl.
*G06F 17/50* (2006.01)

(52) U.S. Cl. .............. 716/2; 716/4; 716/5; 716/19; 716/20; 716/21
(58) Field of Classification Search ............ 716/2, 716/4, 5, 19–21; 702/82, 118; 714/718; 324/760, 765
See application file for complete search history.

(56) References Cited

U.S. PATENT DOCUMENTS

| 5,946,214 | A | 8/1999 | Heavlin et al. |
| 6,449,749 | B1 | 9/2002 | Stine |
| 6,751,519 | B1 * | 6/2004 | Satya et al. ............ 700/121 |
| 6,813,572 | B2 * | 11/2004 | Satya et al. ............ 702/82 |
| 6,832,364 | B2 * | 12/2004 | Heng et al. ............ 716/21 |
| 6,901,564 | B2 * | 5/2005 | Stine et al. ............ 716/4 |
| 6,985,144 | B2 | 1/2006 | Chang |
| 7,006,947 | B2 | 2/2006 | Tryon et al. |

FOREIGN PATENT DOCUMENTS

WO    WO-2005036422    4/2005

OTHER PUBLICATIONS

Allan, G., (May 2002) "Yield/Reliability Enhancement Using Automated Layout Modifications," 2002 IEEE/SEMI Advanced Semiconductor Manufacturing Conference and Workshop, Boston, MA, pp. 252-261.

* cited by examiner

*Primary Examiner*—Vuthe Siek
(74) *Attorney, Agent, or Firm*—Morrison & Foerster LLP

(57) ABSTRACT

An integrated circuit is designed to improve yield when manufacturing the integrated circuit, by obtaining a design element from a set of design elements used in designing integrated circuits. A variant design element is created based on the obtained design element, where a feature of the obtained design element is modified to create the variant design element. A yield to area ratio for the variant design element is determined. If the yield to area ratio of the variant design element is greater than a yield to area ratio of the obtained design element, the variant design element is retained to be used in designing the integrated circuit.

64 Claims, 10 Drawing Sheets

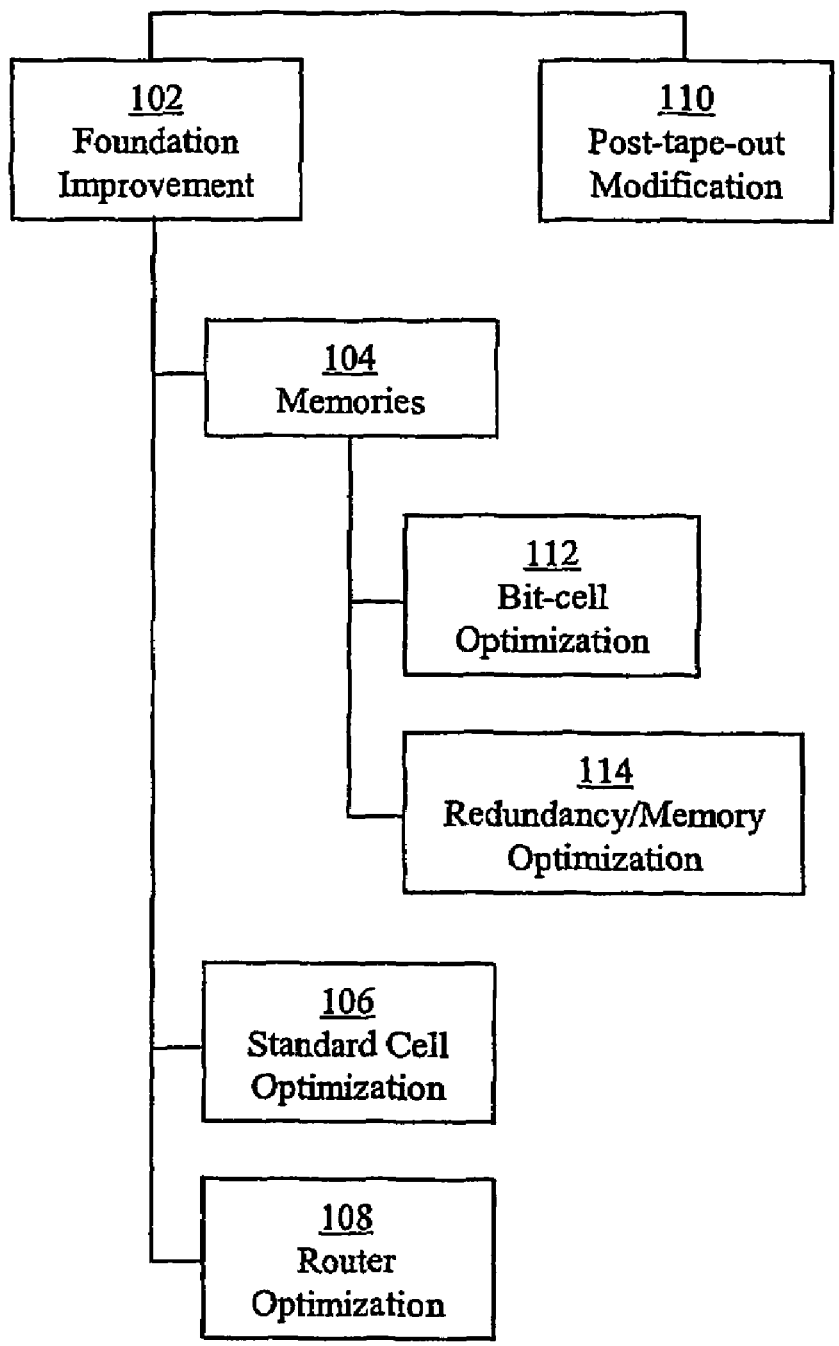
FIG. 1: Taxonomy of Design Based Yield Improvements

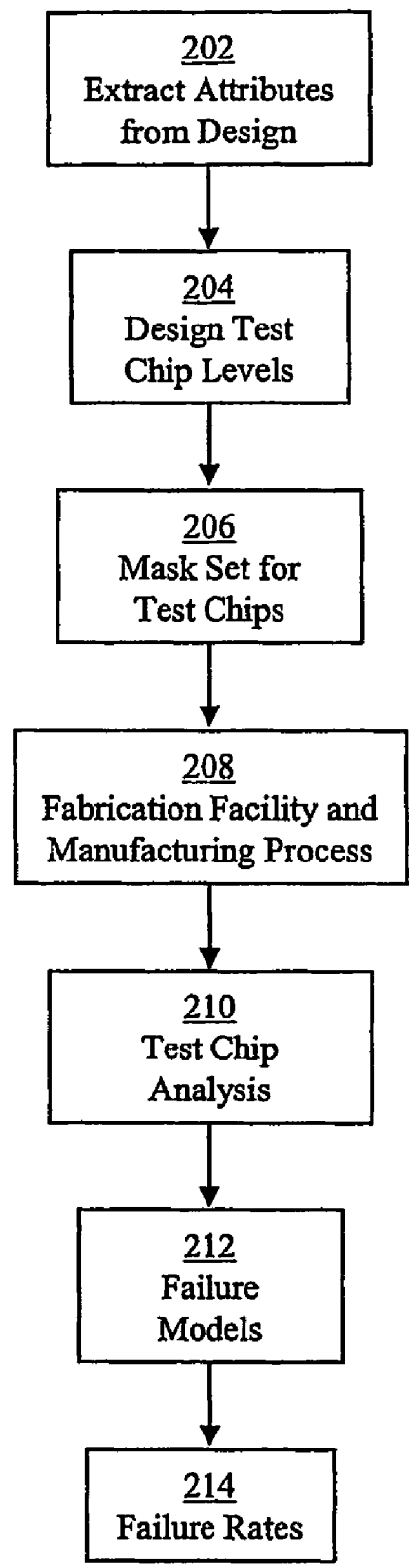
FIG. 2: Determining "Existing Failure Models"

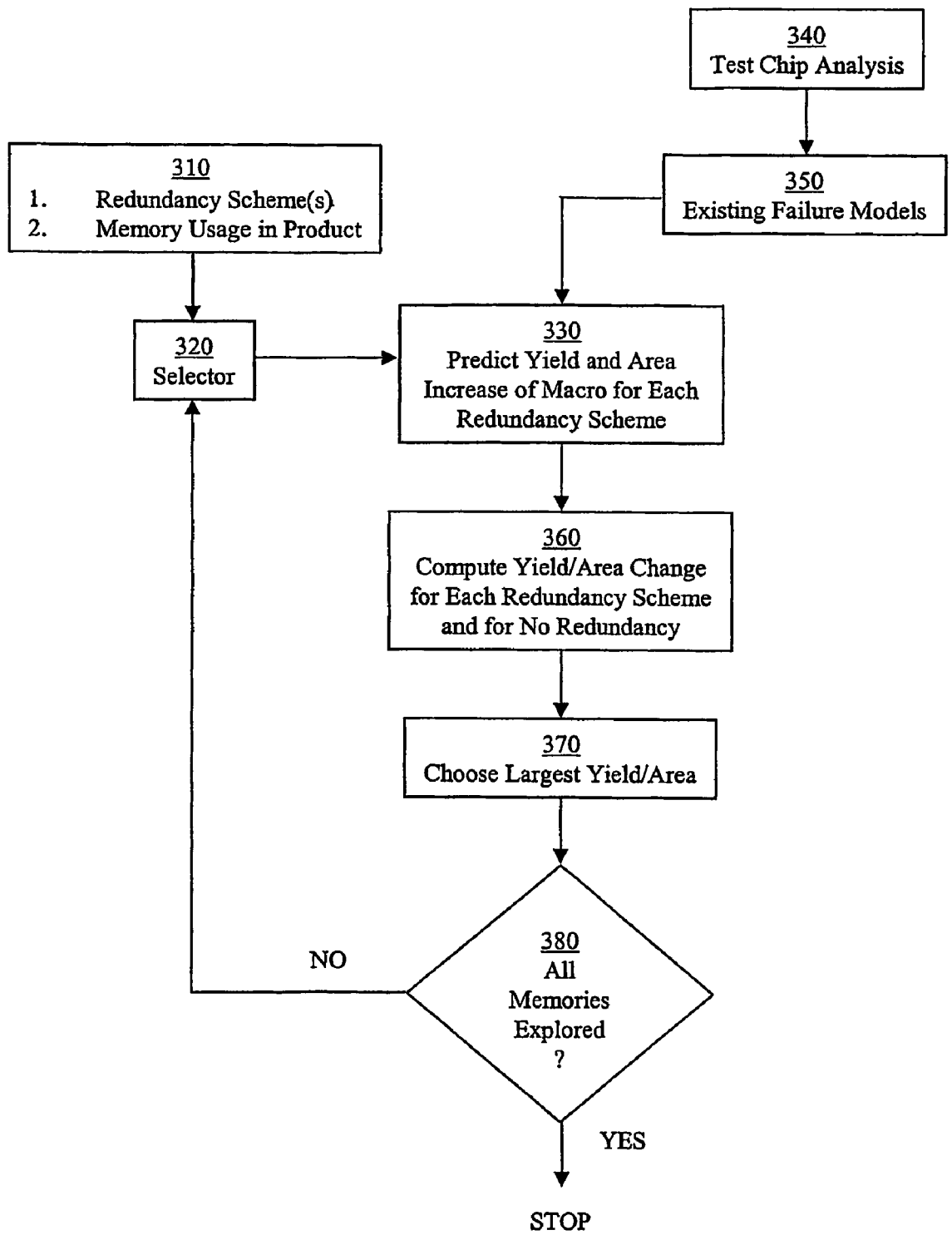
FIG. 3: Bit-Cell Optimization

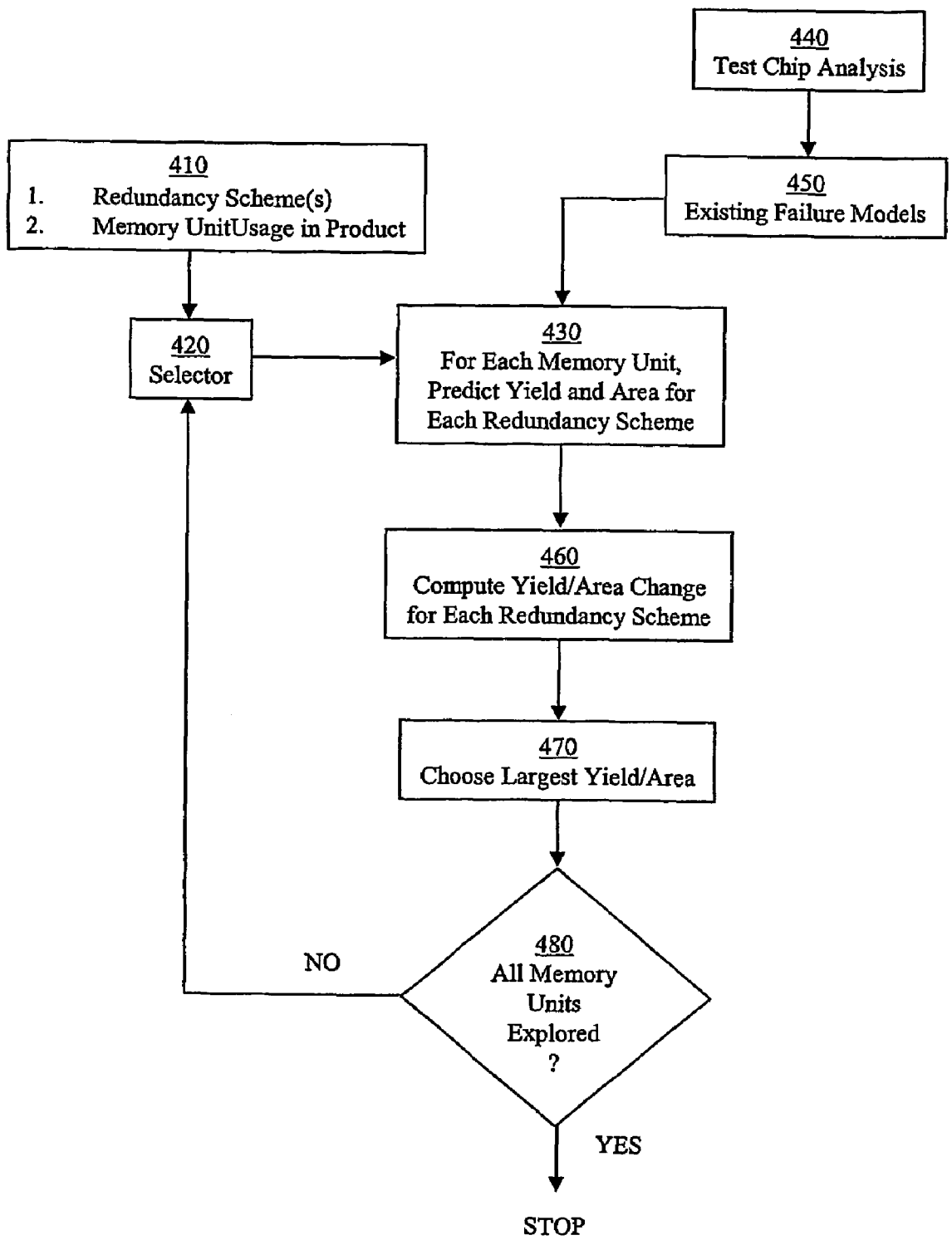
FIG. 4: Redundancy Optimization

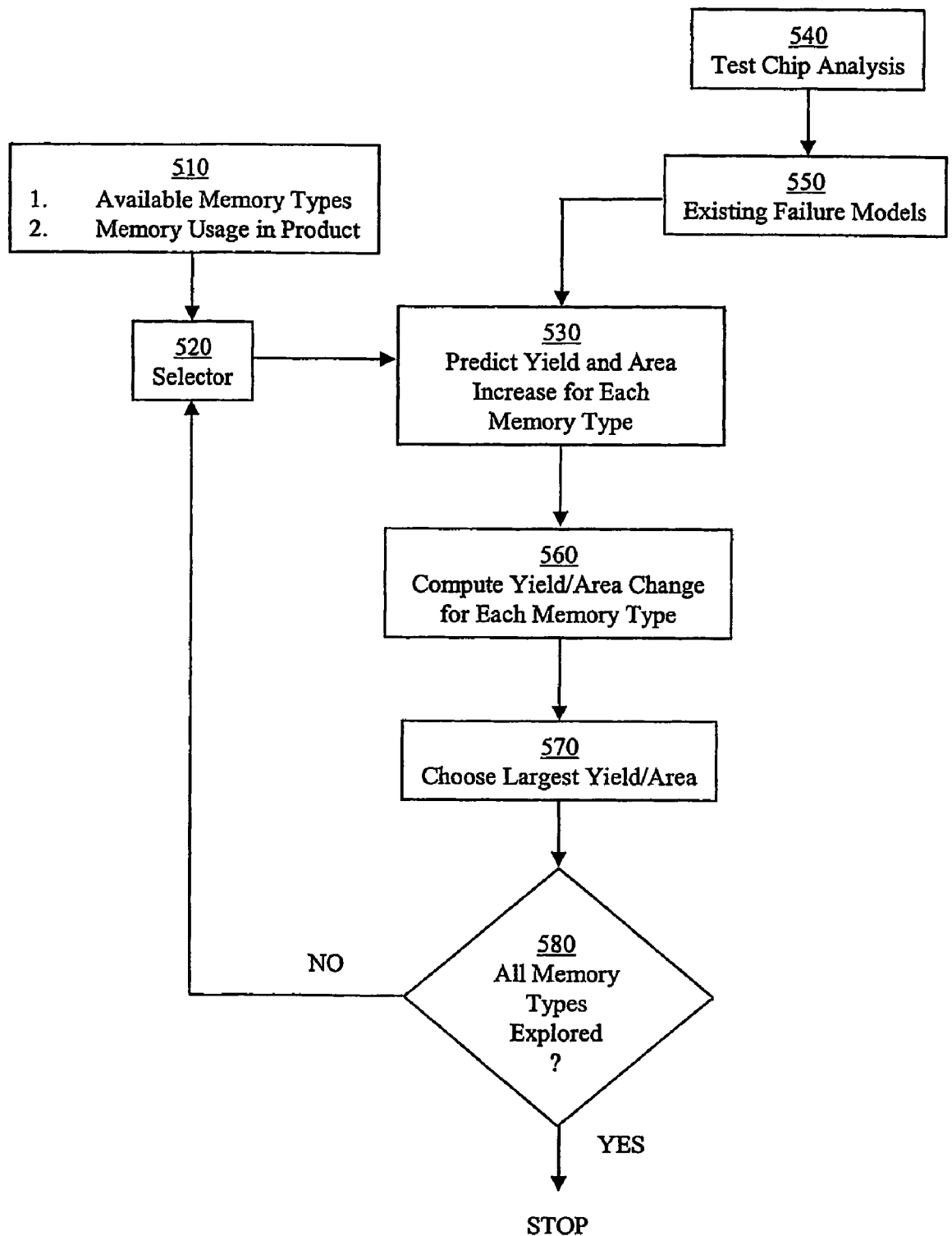
FIG. 5: Memory Type Optimization

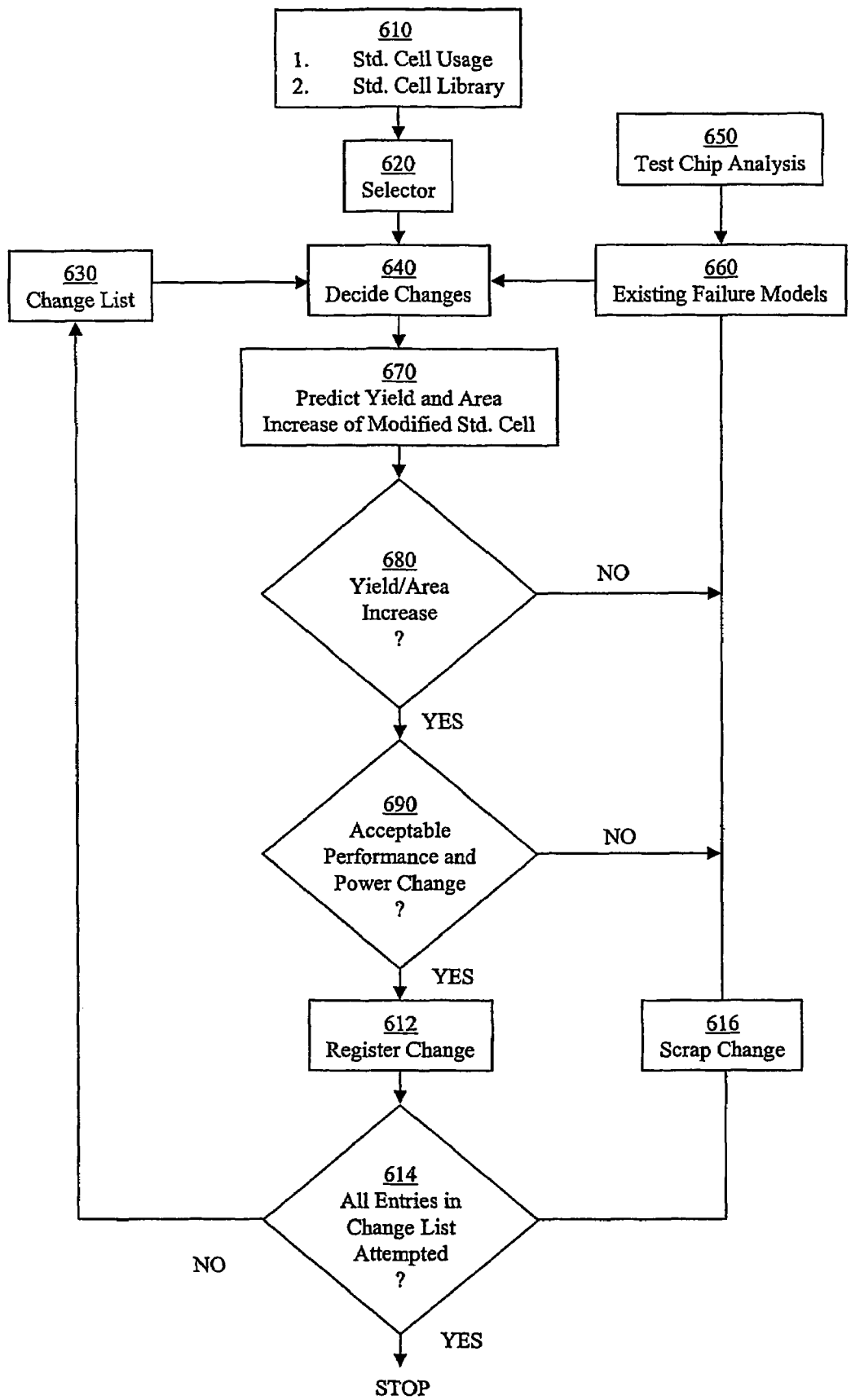
FIG. 6: Standard Cell Optimization

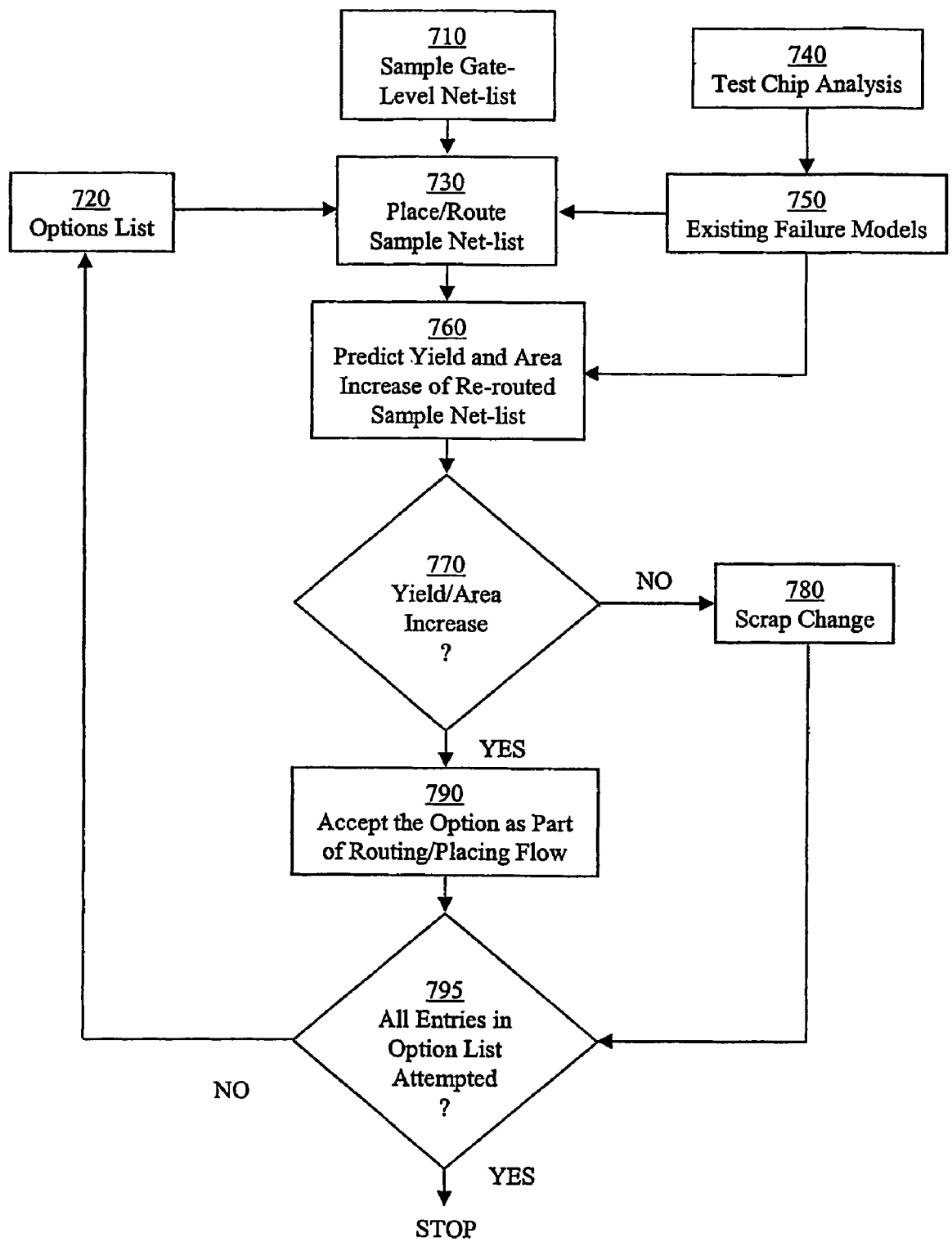
FIG. 7: Router Optimization

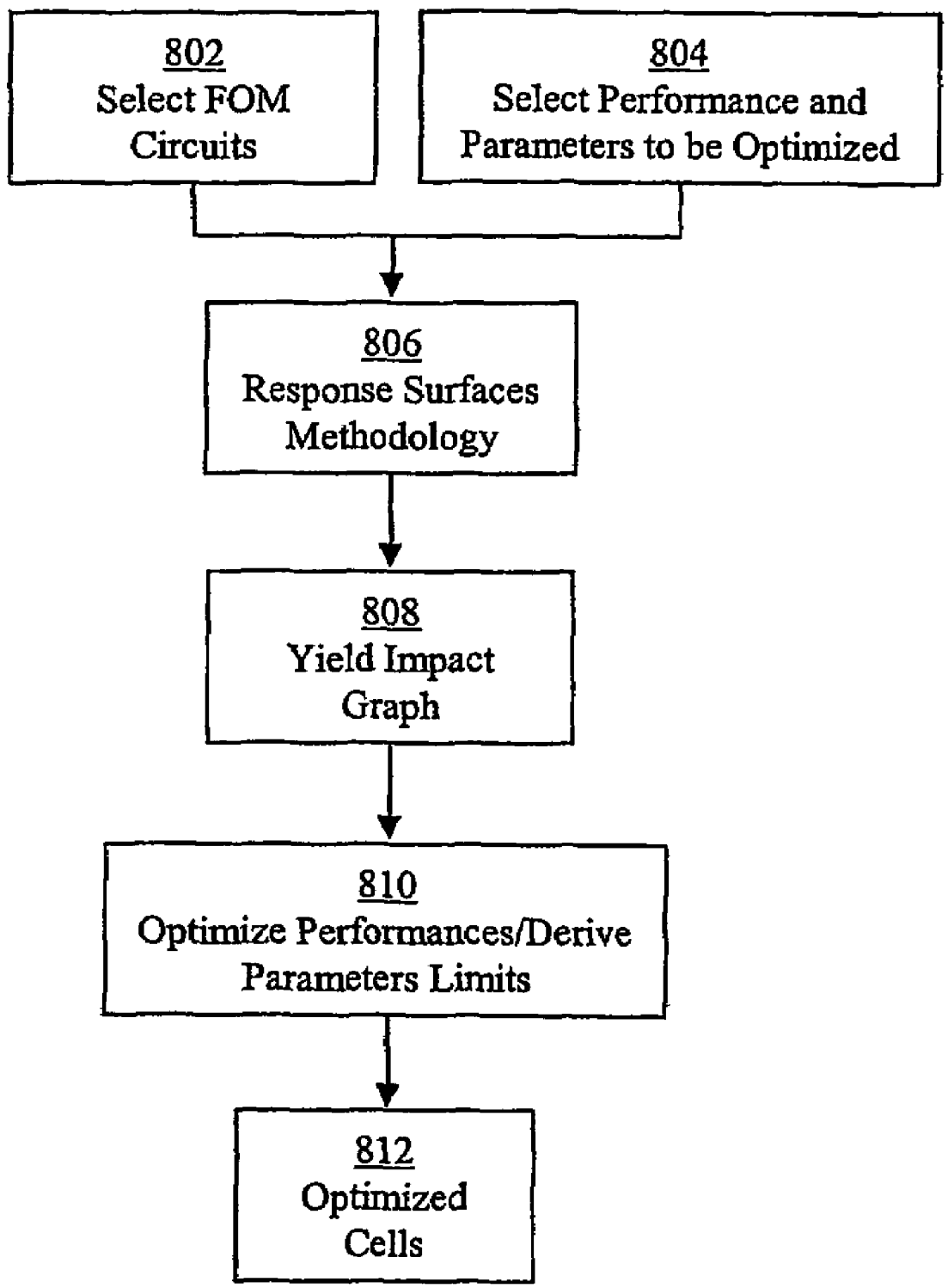
FIG. 8: Parametric Yield Optimization

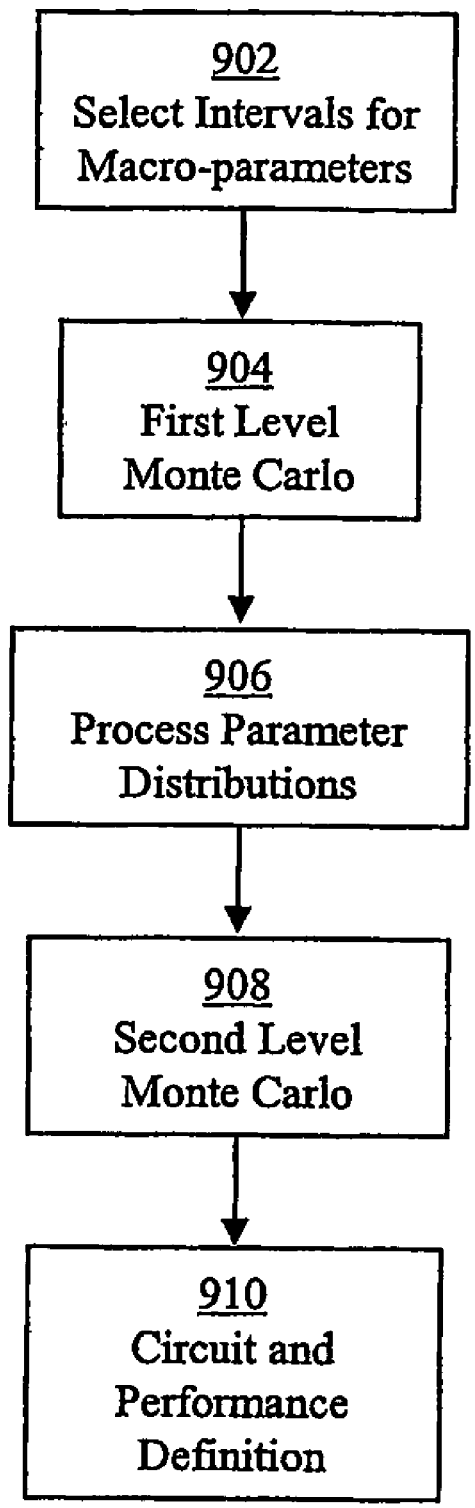
FIG. 9: Yield Impact Graph

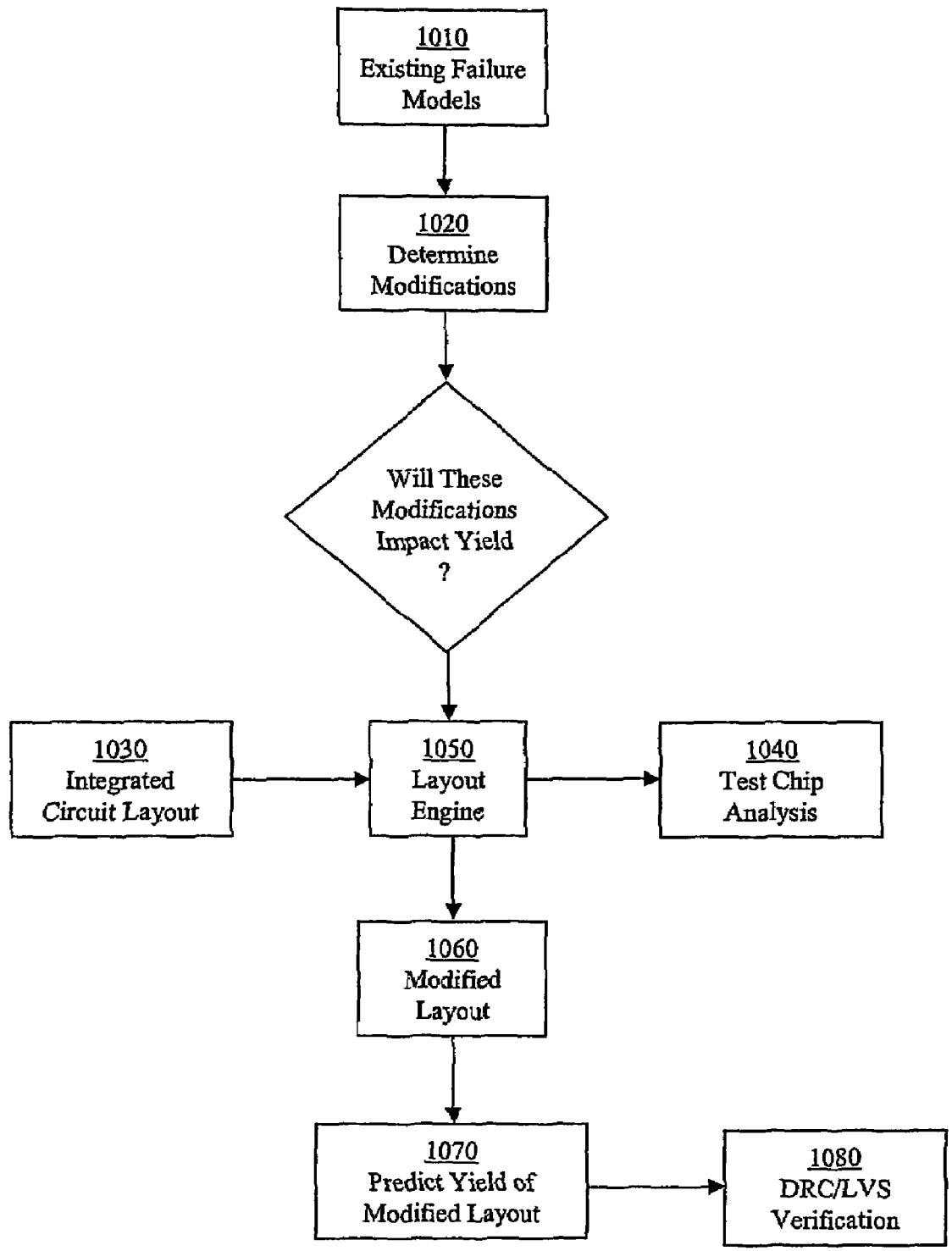
FIG. 10: Post-tape-out Modification

DESIGNING AN INTEGRATED CIRCUIT TO IMPROVE YIELD USING A VARIANT DESIGN ELEMENT

CROSS REFERENCE TO RELATED APPLICATION

This application is a National Stage of International Application No. PCT/US03/037046, filed Nov. 17, 2003, and claims the benefit of an earlier filed provisional application U.S. Provisional Application Ser. No. 60/437,922, entitled YIELD IMPROVEMENT, filed on Jan. 2, 2003, the entire content of which is incorporated herein by reference.

BACKGROUND

1. Field of the Invention

The present application relates to chip design and, in particular, to optimizing existing design rules for improving semiconductor chip fabrication yield.

2. Related Art

The fabrication of integrated circuits is an extremely complex manufacturing process that may involve hundreds of individual operations. Basically, the process includes the diffusion of precisely determined amounts of dopant material into precisely determined areas of a silicon wafer to produce active devices such as transistors. This is typically accomplished by forming a layer of silicon dioxide on the wafer, then utilizing a photo-mask and photo-resist to define a pattern of areas into which diffusion is to occur through the silicon dioxide. Openings are then etched through the silicon dioxide layer to define the pattern of precisely sized and located openings through which diffusion will take place. After a multiple such diffusion operations have been carried out to produce the desired number of transistors in the wafer, the transistors are interconnected by interconnection lines ("interconnects"). The interconnects are typically formed by deposition of an electrically conductive material, which is defined into the desired interconnect pattern by a photo-mask, photo-resist, and etching process. Typically, a completed integrated circuit has millions of transistors contained within 1 cm² of silicon chip and interconnects of sub-micron dimensions.

In view of the device and interconnect densities and feature sizes, it is useful for designers and manufacturing engineers to work together to make changes that improve the manufacturability of a particular integrated circuit. In the past, the activity of designers and manufacturing/process engineers was kept quite isolated. Thus, if a designer obeyed a simple design rule document outlining the smallest feature size or other basic rules, the manufacturability of a particular product could be reasonably well assured.

These design rule documents are no longer sufficient. This can be explained on two main levels. First, from a random defect standpoint, the number of devices, contacts, vias, or other critical attributes on an integrated circuit has surged to approach 100 million or more. It is very difficult to reduce the failure rate of these attributes to acceptable levels to achieve desired yield targets. As such, significant yield loss occurs even for mature technologies.

Second, failure modes specific to the layout environment also occur. For example, the failure rate of contacts in a very isolated area may be very different from contacts in a very dense area because of etch loading or other pattern dependent failures. In the past, such dependencies either did not exist or were not explicitly modeled by either designers or process engineers. In both cases of either heavy use of isolated or dense contacts, the design rules are certainly followed. That is, there is no design rule limiting the number of contacts that a designer can place, nor are there explicit rules about trading off contact density versus yield. This simple example illustrates that current design rules are no longer sufficient to reasonably well assure the manufacturability of a particular product.

Thus, yield prediction and improvement methodologies have been used to better assure that a particular design will result in a manufacturable product. These methodologies are particularly important to fabless companies (i.e., companies that primarily rely on other companies or foundries for manufacturing). For these companies, improving the manufacturability of a particular integrated circuit gives a competitive advantage since the yield improvement is targeted to their products, and not for their competitors' products that may be manufactured using the same foundry. Also, the resulting yield improvement can be very rapid when control is placed with the designer.

In view of the above facts, this application considers the question of how designs are modified to improve the manufacturability of a particular integrated circuit. Such considerations have been embodied before under the rubric of design for manufacturability (DFM) or design for yield, but they have not been performed to the same level or degree of sophistication presented in this application. For example, "Yield/Reliability Enhancement Using Automated Layout Modifications", Allan, G., ASMC 2002, pp. 252-261, Boston (USA), May 2002, which is incorporated herein by reference in its entirety, describes a method for determining layout changes purely by reducing critical area if there is enough chip area to do so. But, this determination is independent of process failure mechanisms and fail rates. The method does not include any priority in what changes will be applied and what changes could be skipped, since they are not a problem for a given process/design combination. The method also focuses on BEOL routing and does not describe a method of how to modify FEOL elements like standard cells and SRAM.

U.S. Pat. No. 6,449,749 B1, "System and Method for Product Yield Prediction," issued Sep. 10, 2002, which is incorporated herein by reference in its entirety, describes a method of yield prediction of a product, and in particular, it teaches a method to extract the random and systematic components of the yield through the design of a test chip that reflects the existing layout properties of a product design. Although this method provides a means to estimate the manufacturability of an existing product design, it does not provide a method to interface with an existing design system and the associated IP components. This application describes a method to utilize the extracted failure rates related to a specific product design, through the use of a test chip, in order to optimize an existing or proposed design that produces an IC product with superior manufacturability attributes.

SUMMARY

In one exemplary embodiment, an integrated circuit is designed to improve yield when manufacturing the integrated circuit, by obtaining a design element from a set of design elements used in designing integrated circuits. A variant design element is created based on the obtained design element, where a feature of the obtained design element is modified to create the variant design element. A yield to area ratio for the variant design element is determined. If the yield to area ratio of the variant design element is greater than a yield to area ratio of the obtained design element, the variant design element is retained to be used in designing the integrated circuit The approach described herein minimizes or eliminates the reliance on an external foundry for targeted yield improvement activities. Using such a methodology, significant yield improvements can be quickly and effectively realized.

As described below in more detail, an exemplary system and method for improving the manufacturability of an integrated circuit at the design level incorporates at least one component of yield estimation together with a design improvement process. The yield estimation component is provided by the analysis of data from a test chip, which is designed to extract and predict the failure rates, including but not limited to the random yield and systematic yield components from the layout attributes of a design. The design improvement process is facilitated through the use of design modifications of the IP components within an IC design system. Design optimization can be utilized within two main categories of the product design flow, specifically, the "foundation improvements" and the "post-tape-out improvements." Foundation improvements include design and layout modifications to libraries, memories, or other commonly used elements, during the design phase. Post-tape-out modifications are changes made after a design has been completed. Foundation improvements can be roughly divided into memory based improvements and standard cell improvements. These are changes that are performed on the memory bit-cells or architecture, and to the library elements, respectively, to improve yield. The changes may be made either generally, i.e., improve yield no matter what semiconductor factory or process is used, or specifically, i.e., improve yield for a specific semiconductor fab or process and, in this case, are not likely to have a substantial impact in more general cases.

DESCRIPTION OF DRAWING FIGURES

FIG. 1 illustrates example taxonomy of yield estimation and improvement process components.

FIG. 2 illustrates an example process to determine failure rates utilizing a test chip design.

FIG. 3 illustrates an example process to optimize bit-cells.

FIG. 4 illustrates redundancy/memory optimization process.

FIG. 5 illustrates a memory type optimization process.

FIG. 6 illustrates a standard cell optimization process.

FIG. 7 illustrates an example of router optimization process.

FIG. 8 illustrates an example process to assess the Parametric Yield parameters to optimize performance parameters of IP components.

FIG. 9 illustrates the process to formulate a Yield Impact Graph (YIG).

FIG. 10 illustrates an example process to apply post-tape-out modifications.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Design Flow

FIG. 1 shows an exemplary taxonomy of yield estimation and improvement process components. Foundation improvements 102 include changes that are made to libraries, memories, or other elements that are common to many designs. Post-tape-out modifications 110 are changes that are made after a design has been completed. Within foundation improvements 102, one can generally classify improvements into three categories: memories 104, standard cells 106, and routers 108. Memories 104 can further be classified into changes to bit-cells 112 and redundancy/memory optimization changes 114.

2. Test Chip Analysis

FIG. 2 illustrates an exemplary method for obtaining the failure rate data related to a product design system, including but not limited to the systematic yield and the random yield components. In general, the layout features of the IP components together with the product design rules in 202 are used to design a representative test chip in 204. A mask set is generated in 206 and the test chip is fabricated with the representative manufacturing process in 208. Data from the test chip is analyzed in 210 and is used to populate failure models in 212 that allow for the prediction of the random and systematic yield components of the product design. Failure rates can then be determined in 214.

3. Bit-Cell Optimization

FIG. 3 shows an exemplary process to optimize bit-cells. Typically, this process is used relative to a particular integrated circuit (i.e., with a known memory usage), but it can be generalized by assuming a memory usage based on a composite of integrated circuits from the same family (e.g., DVD, Network processors, etc.). The inputs 310 to the process also include the modified bit-cell or a selection of modified bit-cells.

In general, designing a modified bit cell follows a process of:

Selecting one out of many original bit-cells in the design;
Adding double contacts (either without changing the area of the cell or with changing the area of the cell); and
Identifying a systematic failure model (high failures for design rule borders) and designing or modifying the bit-cell to avoid attributes that can cause high failure mode.

The process may be repeated for all the cells in the design.

The selector 320 determines to which memory macro the modified bit-cell should be applied. Typically, the modified bit-cell is applied to the smallest memory macros first and then the larger are tested sequentially using the process steps 330 to 370. In this way, if an integrated circuit will use 4 8K macros, 12 16K macros, and 4 32K macros, the process is initially carried out on the 8K macro, then on the 16K macro, and then on the 32K macro.

Next, the yield and change in area using the modified bit-cell is computed (step 330) based on one or more existing failure models (350) provided by the test chip analysis (340). While any method can be used, the method described in U.S. Pat. No. 6,449,749 is preferred. The change in area $\Delta A$ (if any) is simply computed as:

$$\Delta A = [(\text{area of modified bit cell}) - (\text{area of original bit cell})] \times [\text{Number of bits in macro}]$$

If the yield of the memory macro with the modified bit-cell is designated as Y' with corresponding area $A+\Delta A$, and the yield of the original memory macro is designated as Y with corresponding area A, then at step 360, $Y'/[A+\Delta A]$ is compared to Y/A, as Yield/Area is an acceptable approximation of expected number of acceptable chips on a wafer. If $Y'/[A+\Delta A]$ is greater than Y/A, then at step 370 the bit-cell for the selected macros are changed. If there was no increase (i.e., Y'/[A+ΔA] is the same as Y/A), then the modified bit-cell is not used for the selected macro. At step 380, the process of step 320 through 370 is repeated until all macros have been evaluated.

The process depicted in FIG. 3 is applicable to any type of memory element, such as SRAM, DRAM, ROM, FLASH, etc.

4. Redundancy Optimization

Redundancy optimization determines an optimal redundancy scheme for an integrated circuit. This is not a simple optimization because while adding redundancy usually helps yield, but it also increases the area of an integrated circuit. The process shown in FIG. 4 is followed to determine which macros on an integrated circuit will lead to more good chips per wafer—a strong metric for manufacturability.

The inputs 410 to the process shown in FIG. 4 are the redundancy schemes to be considered (such as, for example, 1-Row, 1-Col repair; 0-Row, 1-Col Repair; etc.) and the listing of memory units that will be used in a particular integrated circuit. If information about a specific integrated circuit is not known, then a representative sample or best guess is used. Memory units are groups of memory that have redundancy or could have redundancy attached to them. In many cases, each unit is just a memory macro. However, in some cases, redundancy is applied to groups of macros at a time rather than one-at-a-time.

In one example, the selector 420 first sorts all of the memory units in order of largest macro area to smallest macro area, including periphery. It is preferable to do this because the units with the largest size macros usually benefit the most from redundancy. In this way, if an integrated circuit will use 4 8K macros, 12 16K macros, and 4 32K macros and the redundancy scheme used by a designer is for each macro, the process is utilized first on units with the 32K macro, then on units with the 16K macro, and then on units with the 8K macros.

Next, for each input redundancy scheme selected at 420, the yield is predicted (430) with its associated change in area ΔA (460), using the data provided by the test chip analysis (440) to populate one or more failure models (450). The method described in U.S. Pat. No. 6,449,749 is preferred, although other methods may be utilized. The change in area may be computed as:

$$\Delta A = [(\text{area of unit with redundancy scheme}) - (\text{area of original unit})] \times [\text{Number of units}].$$

If the yield of the memory unit with a particular redundancy "i" scheme is designated as $Y_i$ with corresponding area $A+\Delta A_i$, and the yield of the original memory unit is designated as Y with corresponding area A, then at step 460, $Y_i/[A+\Delta A_i]$ is computed for each redundancy scheme "i". At step 470, the redundancy scheme "i" with the largest yield/area ratio is found. The scheme with the largest yield/area ratio is then selected. Sometimes the original unit has the largest yield/area ratio. In this case, no redundancy is desired for this unit. Yield/area is utilized for the comparison in this example because this is an apparently effective estimate for the number of good die per wafer. Step 480 indicates that the process of steps 420 to 470 is repeated until all units have been evaluated.

5. Memory Optimization

A memory type optimization process is shown in FIG. 5. The process shown in FIG. 5 is similar in many respects to the redundancy optimization process shown in FIG. 4. Many integrated circuits are used in embedded applications (e.g., embedded DRAM, embedded FLASH, etc.). However, serious consideration is often not made towards which memory macros are desirable for use with embedded architecture, versus standard SRAM. For very large macros, the choice is often obvious, but for smaller macros, it often is not clear a priori. FIG. 5 illustrates a method to quantify the tradeoffs to optimize the yield of good chips per wafer.

The inputs 510 to the memory type optimization process are the available memory types (e.g., SRAM with 1R1C redundancy, SRAM with 0R1C redundancy, embedded DRAM with redundancy, etc.) and the listing of memory macros that will be used in a particular integrated circuit. If information about a specific integrated circuit is not known, then a representative sample or best guess is used. Finally, it is confirmed which macros potentially use alternative memory types. Sometimes, performance considerations suggest SRAM architecture instead of slower embedded memory types. These considerations are accounting for during the process.

Step 520 is similar to step 420 in that the selector starts with the units having the largest memory macros and moves to the units having the smallest memory macros. For each memory type addressed by the selector 520, the yield is predicted with its associated change in area (530), using the data provided by the test chip analysis (540) to populate the failure models (550). Preferably, the Yield per and change in area is computed (560) for each memory type, where the change in area is defined by:

$$\Delta A = [(\text{area of macro with new memory type}) - (\text{area of original macro})] \times [\text{Number of macros}].$$

At step 570, the memory type with the largest yield to area ratio is chosen, or the original memory type is chosen if there is no increase. Step 580 indicates that the process continues until all units with all memory macros have been considered.

The redundancy optimization process may also be applicable to ROM in limited situations, and the memory type optimization process sometimes allows the use of ROM instead of RAM type memories (e.g., in cases where the designer feels that the data to be held in the memory will be static and unlikely to change). The liberal use of ROM is an often-overlooked facet of yield improvement during integrated circuit design.

Because the design of a bit-cell may strongly impact the desirability of redundancy, it may be useful in some cases to co-optimize redundancy selection with bit cell modification. In this case, the processes illustrated in FIGS. 3 and 4 are carried out in a similar, but cooperative, manner.

6. Standard Cell Optimization

The standard cell optimization flow 106 (FIG. 1) process is carried out either by operating manual changes on the design of the cells, or by using automated tools to produce cell variants. This flow may be applied to pre-tapeout and post-tapeout design optimization. FIG. 6 illustrates an exemplary process based on operation with manual changes. An exemplary process is also described that is based on operation with automated layout manipulation tools.

In both examples, the first step 610 is to identify the standard cell library on which to operate. One criterion for the selector 620 is the frequency of use for the IP components in a standard cell library that is being addressed. Table I is an exemplary pareto of the cells used most frequently in the target integrated circuit, or averaged across a family or collection of integrated circuits.

TABLE 1

Example Pareto

| # | Standard Cell | % Instances |
|---|---|---|
| 1 | N1NV | 18% |
| 2 | N1AND | 9% |
| 3 | N1SX23 | 8% |
| 4 | N1T4S | 8% |
| 5 | N1Y24 | 8% |
| 6 | N1XOR | 7% |
| 7 | N1FFSR | 7% |
| 8 | N1FFQQ | 6% |
| 9 | N1NVX2 | 5% |
| 10 | N1YYX2 | 4% |
| 11 | N1XO2X | 2% |
| 12 | N1ANDX2 | 1% |
| 13 | N1ANDX4 | 1% |
| 14 | N1TYX2 | 1% |
| 15 | OTHERS | 15% |

The second step 620 includes applying a selector to identify which standard cells to potentially modify. The criterion used by the selector to choose a cell from the library is a measure, or an estimate, of the maximum overall impact that improvements on each cell will have on the number of good dies per wafer (GDW) for the target product. The GDW can be estimated by multiplying the projected chip yield by the number of chips on a wafer. The change in GDW, ΔGDW, for the case of modified cells, can be estimated by multiplying the projected chip yield obtained from placing modified cells into the integrated circuit by the resulting number of chips on a wafer, and comparing the resulting GDW to the GDW corresponding to the original cells. In the case where incorporation of modified standard cells into the integrated circuit requires an increase in the chip area, a minimum improvement requires at least an increase in the product of the resulting chip yield times the resulting number of chips per wafer.

ΔGDW(X) indicates the maximum increment of GDW achievable by making enhancements in cell X. All cells are sorted by decreasing value of ΔGDW(•), i.e., for every cell $X_i$: ΔGDW($X_i$)>=ΔGDW($X_{i+1}$). A set of N cells chosen are the set of the first N cells according to this order: ($X_1, \ldots X_N$). The size of this set is determined by the selector, based for example on the following considerations:

the minimum increment GDWmin in GDW desired in the product:

GDWmin<=$\Sigma_{i=1\rightarrow N}$ΔGDW($X_i$);

the maximum number NC of cells that can be changed for improvement (this limit is mostly due to the processing involved in performing cell modifications and characterizations);

the incremental benefit ΔGDW($X_{N+1}$) of adding the (N+1)-th cell to the selected set of N.

If the impact ΔGDW of modifying a cell were the same for all the cells of a library, the selector may simply choose the standard cells which account for most of the instances in the product. However, in general, such impact depends on the number of critical features (contacts, interconnects, transistors, etc.) and on the density of shapes within the area of the cells. The selector applies rules and heuristics appropriate to estimate the order of the cells and the respective values of ΔGDW.

If a cell X is modified without changes in its area A(X), the value of ΔGDW(X) is given by the yield improvement ΔY(X) for cell X, times its multiplicity N(X), times the current number of GDW:

ΔGDW(X)=ΔY(X)·N(X)·GDW (no area changes).

However, if the area of the cell changes by ΔA(X), the impact on GDW is computed by accounting for the changes in the number of dies per wafer.

The change list 640 include design modifications to consider. Examples of changes include, but are not limited to:

Widening the spacing between diffusions, or between polysilicon or metal interconnections;

Doubling contacts on N-type and/or P-type diffusion area;

Doubling contacts on polysilicon;

Adding or widening borders on metal around contacts (including rules on the minimum number of sides on which this is performed);

Widening polysilicon interconnects over N/P junctions;

Changing silicide overlaps.

All of these changes may impact yield. However, it may be possible to implement them all simultaneously, in which case tradeoffs between different improvements are explored.

As an example, widening metal borders around contacts reduces the spacing between metal shapes, and therefore it increases the critical area and the corresponding probability of failure due to shorts caused by random defects. Another example is the relatively common case where there is space to double only one contact, while two contacts are competing for that space, one on polysilicon and one on an N- or P-type diffusion. In general, the combination that may be considered optimum is the one that maximizes the yield of the individual cell, e.g., as measured by a yield estimator, through the use of a test chip, such as is disclosed in U.S. Pat. No. 6,449,749, based on the failure rates for each feature, as measured for that technological process. The selection of an optimum set of modifications is a complex task, which can be done manually, or with the use of automation software.

a. Procedure I: Standard Cell Optimization through Manual Changes

The following Procedure I describes the exemplary process shown in FIG. 6, where the selection is done manually.

The change list 630 includes design modifications to consider. Choosing which design modifications to try first may be a matter of judgment, but usually begins with the consideration of existing failure models (660) as they are applied to the selected list of IP components from a typical use list as demonstrated in Table 1. The results of the existing failure models are obtained and applied to each IP component candidate, using the test chip analysis data (650) to populate one or more failure models. For example, if the fault rate for contacts is very high compared to other modules such as metals, poly, etc; then, adding double contacts may be one of the best first changes to try. Conversely, if metal shorts are poor but the contact module is good, then adding spacing between metal lines may be one of the best first changes to try.

The yield and area increase of the modified standard cell as a result of applying the changes decided in step 640 is computed next, at step 670. The yield/area increase is computed in step 670 as: $Y_f^n/(A+n\Delta A)$ compared to $Y_i^n/A$, where A is the area of the integrated circuit or an average area in the case of foundation improvement; $Y_i$ is the initial yield of the standard cell; $Y_f$ is the improved yield of the standard cell as computed in step 670; n is the number of instances of this standard cell in the integrated circuit as determined, for example, from a usage table. ΔA is the expected area increase in the standard cell from making the changes determined in step 640.

If there is an increase in the yield/area ratio (680), then the candidate is evaluated with respect to an acceptable performance and power change (690). The projected performance change in the modified cell can be estimated in a number of ways including manual procedures. A performance change estimation could be done using SPICE or other circuit simulation systems. An example of the performance manufacturability trade-off is the case for adding double contacts, which may significantly improve manufacturability, but it may degrade performance unacceptably because of added capacitance or transistor width. Assuming the performance change projection is acceptable, the changes are retained/registered (612) for the cell. That is, they are made a permanent part of the library element. If not, the changes are scrapped (616). Step 614 indicates that the steps of FIG. 6 are repeated until all possibilities in the change list 630 are considered on all standard cells selected in step 620.

b. Procedure II: Standard Cell Optimization Based on Layout Manipulation Tools.

The Procedure II is similar to the Procedure I, except that the yield and area increase estimation step 670 is carried out on a layout that is generated based on potential corrective modifications.

Layout manipulation tools, such as layer arithmetic engines and scanline based constraint graph optimizers are utilized in Procedure II. These tools are available in many commercial applications, typically used for DRC and compaction, such as Dracula® by Cadence Design Systems, Calibre® by Mentor Graphics, SiFix® by Sagantec, and others.

At step 610, a list of failure mechanisms and corresponding potential corrective actions is compiled. For each of the N cells identified by the selector, the automated layout manipulation tools are applied to combinations of the corrective modifications (all or part of them), in various possible orders. For each combination, a variant is produced for the cell that corresponds to different tradeoffs. The set of all the variants produced for a cell constitutes a design of experiments in the space of the enhancements to that cell. This is also repeated, allowing a fixed increase in the width of the cell variants.

The yield of each variant is estimated, utilizing the test analysis data derived from the test chip, as described in FIG. 2, to populate one or more failure models, and the ones with maximum yield, with and without an area penalty are selected. The others are discarded. If the yield of the variant with area penalty is the same (within a predefined tolerance, given by the accuracy of the failure models results), as the variant without area penalty, the former variant is also discarded.

If the variant with area penalty has better yield than the one without, the impact on area is computed (due only to the instance counts) of replacing all its instances with the variant. Then the impact on GDW of both variants is computed, and the one with higher ΔGDW is utilized, discarding the other.

The selected variant is extracted and re-characterized using standard circuit-level simulation.

7. Router Optimization

FIG. 7 shows an example of router optimization (108 in FIG. 1). In most examples, the process shown in FIG. 7 is useable only in a foundation environment (i.e., before tape-out). At step 710, a sample gate-level net-list is chosen to evaluate the optimization. Typically, the net-list is from a small (about 1 mm$^2$) common circuit component (e.g., a multiplier or arithmetic-logic-unit). The options list 720 includes changes to the router/placer configuration file or router/placer options/switches that may have an impact on the yield of an integrated circuit. Examples include: doubling vias where room allows, forcing double vias, router efficiency trade-offs, modified router spacing and width, modified over-the-cell routing, etc.

After placing and routing the sample net-list at step 730, the yield and area change are predicted at step 760 by utilizing the yield predication methods from the analysis of the test chip data 740 to populate at least one of the existing failure models 750. If the yield/area is increased compared to placing/routing the same net-list without any modifications (770), then the modification is accepted at step 790. Otherwise, the modification is scrapped at step 780. The process continues until all options in the option list are tried at 795.

8. Parametric Yield Optimization of Standard Cell Libraries

Standard cell libraries are typically optimized in a stand-alone fashion, with each cell being individually optimized according to constraints on speed, power consumption, area, etc. Some parameters of the cell, like the ratio between the widths of nmos and pmos devices are typically optimized ($w_n/w_p$ ratio). This often leads to simple straightforward choices of the cell parameters. For instance, if the primary objective of the optimization is speed, a high drive current (i.e., maximum $w_n/w_p$ ratio) may be an obvious result. However, standard cells that are used together interact in ways that are not accounted for in a stand-alone optimization. For instance, higher drive currents may result in an increased input load that may slow down the previous cell, whereas a lower drive capability might have been compensated by a corresponding smaller load to the previous cell.

Parametric yield effects are frequently unaccounted for because of the inherent modeling difficulties. One example of the problem of modeling the parametric yield is that parametric spreads might change during the lifetime of a manufacturing process due to changes in equipment characteristics and/or process control. In order to address such issues, a different standard cell library characterization strategy may be utilized, as described with reference to FIG. 8.

Given the target products of a technology, a set of Figure of Merit (FOM) circuits are selected (step 802). These circuits are representative of the types of designs to be implemented in a particular technology. Examples are: a critical path of a digital circuit, a clock path, a scan path, a core, a memory path, a data path, and DSP modules, etc. The optimization can be carried out using such circuits as a benchmark. By using standard Response Surface Methodology flows (step 806), the parametric yield of the FOM circuits are estimated as a function of a certain set of "macroparameters" selected in step 804 (e.g., threshold voltage, drain currents of nmos/pmos devices, design parameters etc.). At step 808, a range or a set of values, e.g., the ratio $w_n/w_p$, that makes the FOM Circuits achieve a desired parametric yield are determined using Yield Impact Graphs (YIG), as illustrated in FIG. 9. These graphs include plots of parametric yield as a function of process parameters distributions. Using a YIG for the cells in a standard cell library, parametric yield changes with unavoidable process shifts are delineated, which provide an estimate of the relative sensitivity (robustness) of the cells to such changes. Different variants with different performances/parametric yield/robustness trade-off are then generated at step 810, yielding optimized cells (step 812).

9. Yield Impact Graph

Yield Impact Graphs (YIGs) represent the impact of process variations and design parameters on the performance of a digital circuit. These models represent both sensitivity and statistical distribution of the performance (speed, for example) of any digital path with respect to either the Probability Density Function (pdf) parameters of a set of electrical and physical parameters ("macro-parameters"). By comparing path delay with timing constraints, the impact of macro-parameter variability on parametric-limited yield (or performance-limited yield) is also assessed. Functional models of the delay as a function of one of the macro-parameters are constructed, assuming the distributions of all the remaining macro-parameters are constant using the following definitions of their properties:

$g_2(m_i, s^R)$=minimum and maximum delay, as a function of the mean value of one macro-parameter $m_i$, assuming that the standard deviation of $m_i$ remains constant and equal to $s^R$.

$g_3(m_i, m^R)$=minimum and maximum delay, as a function of the standard deviation of one macro-parameter mi, assuming that the mean value of $m_i$ remains constant and equal to $m^R$.

$G_2(m_i, s^R, t_{min}, t_{max})$=speed-limited yield, with respect to a pair of timing constraints, $t_{min}, t_{max}$, as a function of the mean value of one macro-parameter mi, assuming that the standard deviation of mi remains constant and equal to $s^R$.

$G_3(m_i, m^R, t_{min}, t_{max})$=speed-limited yield, with respect to a pair of timing constraints, $t_{min}, t_{max}$, as a function of the standard deviation of one macro-parameter $m_i$, assuming that the mean value of $m_i$ remains constant and equal to $m^R$.

These models use a predefined reference distribution characterized by its mean and standard deviation $\{m_i^R, s^R(m_i)\}$, denoted as the reference distribution for $m_i$.

An exemplary method to build a yield impact graph is depicted in FIG. 9. The yield impact graphs are typically all built simultaneously.

1) Select the number $N_{m,i}$ of intervals for the mean of macro-parameter $m_i$, (902). These intervals are distributed uniformly and have the same width $dm_i$. Select the number $N_{s,i}$ of intervals for the standard deviation of macro-parameter $m_i$. These intervals are distributed uniformly, and they all have the same width $ds(m_i)$. The criteria for the selection of the widths for these intervals depend on the desired error and computational cost desired, as described below.

2) Run a probabilistic model involving an element of chance, such as a Monte Carlo experiment (904) on the space of the means and standard deviations of all uncorrelated parameters $P=(p_1, p_2, \ldots p_{Np})$ (906). Each iteration corresponds to a random set $(p_1, p_2, \ldots p_{Np}, s(p_1), s(p_2), \ldots s(p_{Np}))$ of means and standard deviation values for each of the parameters in P. For each iteration, the values of all the corresponding macro-parameter means and standard deviations $(m_1, m_2, \ldots m_{Nm}, s(m_1), s(m_2), \ldots s(m_{Nm}))$ are computed by using the known models $m_i=m_i(p_1, p_2, \ldots p_{Np})$. Monte Carlo sampling will terminate when the following conditions are met:

a) For each interval of the mean of macro-parameter $m_i$, at least one distribution with mean within that interval and standard deviation within less than a small pre-determined fraction (e.g., 10%) of $ds(m_i)$ from the reference $Ds^R(m_i)$ has been found.

b) For each interval of the standard deviation of macro-parameter $m_i$, at least one distribution with standard deviation within that interval and mean within less than a small predetermined fraction of $dm_i$ from the reference mean $Dm_i^R$ has been found. Using 10% of $dm_i$ is recommended.

3) For each of the distributions found that meet condition (a) above, run a second level Monte Carlo analysis (908). At each iteration, compute the value of t and compare it with the timing constraints, $t_{min}, t_{max}$. The minimum and maximum value of t that meet the constraints provide the values for model $g_2$, corresponding to the center $m_i$ of the interval of the mean of macro-parameter $m_i$, where the distribution had been found. The ratio between the number of samples that meet the constraints and the total number of samples is the yield value of $G_2$, corresponding to $m_i$. If more than one sample was found for this interval, the one with the highest value of $G_2$ is selected, and the others are discarded.

4) For each of the distributions found that meet condition (b) above, run a second-level Monte Carlo (908), at each iteration compute the value of path delay t, and compare it with the timing constraints, $t_{min}, t_{max}$. The minimum and maximum value of t that meet the constraints provide the values for model $g_3$, corresponding to the center $s_i$ of the interval of the standard deviation of macro-parameter $m_i$. The ratio between the number of samples that meet the constraints and the total number of samples is the yield value of $G_3$ corresponding to $s_i$. If more than one sample was found for this interval, the one with the highest value of $G_3$ is selected, all the others are discarded. The mean and standard deviation values of all uncorrelated parameters for this sample are assigned to model $G_3$.

5) Utilizing the results obtained in (3) and (4) above for selected macro-intervals, the performance of the relevant circuits in an IC design can be defined (910) and utilized, for example, for the optimization of cells design (810).

10. Post-tape-out Modification

Post-tape-out layout refers to a design that has finished the place/route cycle and has also finished the DRC/LVS/timing closure procedures after place/route. The next step in the design cycle would be MDP (Mask Data Processing which could include OPC, E-Beam proximity correction, etc.) and then writing to a mask. The post-tape-out layout modifications may be applied either before MDP or after some/all parts of the MDP flow has been applied to the layout.

Depending on the verification procedures/constraints on the particular design, there might be constraints to the post-tape-out layout modifications. These constraints could be constraints on any of the layout parameters including chip-size, cell hierarchy, port locations, specific portions of the layout (analog, RF, memory etc.).

FIG. 10 shows an exemplary process to apply post-tape-out modifications (110 in FIG. 1) to improve the manufacturability of integrated circuits. The process starts (1010) by either determining current failure modes in the fabrication process, or by hypothesizing certain failure modes to be present based on experience. The failure modes addressed in post-tape-out modifications are typically dependent on layout attributes. A via failure is an example of a failure that depends on layout attributes, e.g., strongly dependent on the border size or extension length of the lower layer metal. General metal shorting (i.e., metal shorting that is not specific to a particular layout configuration or placement) is not a failure mode typically addressed in post-tape-out modification.

To determine which of the layout attribute dependent failure modes to consider for post-tape-out modifications, the yield impact of the modification is determined. First, the layout attributes of interest are extracted. Next, the available attributes that are of interest are identified in step 1020. In the example of the vias, the single vias may be extracted, along with the metal border statistics. Using the information of the single vias with minimum border, as well as how much the border can be increased without violating the metal spacing design rule, the number and location of the via borders to be considered for modification is determined.

A layout engine is used to effect the modifications at step 1050 of the integrated circuit layout (1030). A layout engine is a generic computer aided design (CAD) tool that can manipulate layout patterns and shapes. For the most flexible and best results, the CAD tool is preferably custom designed and implemented.

The yield impact of the chosen IP components and layout is evaluated, utilizing the test chip analysis (1040). A modified layout is produced at step 1060, taking into account the added critical area due to the increased metal from increasing the border.

The process steps 1010 to 1060 are continued until all recommended changes have been completed. Once the layout has been modified for all recommended changes, the expected yield increase is predicted at step 1070, utilizing the test chip analysis (1040) (see also U.S. Pat. No. 6,449,749). This is followed by a DRC/LVS verification check at step 1080. A timing closure check may be performed, typically depending on the extent of the modifications.

For this example of a post tape-out design optimization involving border/via trade-offs, if increasing the border has the effect of offsetting the increased chance for metal shorts, then the layout modification is performed. On the other hand, if the yield impact modeling shows that the yield loss due to increased metal shorts overwhelms the gain from adding the via borders, then either the border increase is not performed, or the proposed border amount is decreased until added yield benefit is obtained. Tradeoffs also occur among attribute modifications. For example, there may be enough space to largely increase the metal border, or double a via while leaving a minimum border. Each of these scenarios is built into the yield models (see also U.S. Pat. No. 6,449,749), and the choice that results in a higher yield gain is selected. In addition to current yield estimates, yield models are built assuming future process improvements to ensure that the layout modifications continue to be beneficial throughout the life of the process (see also PCT Application No. PCT/US03/29758, "Integrated Circuit Design to Optimize Manufacturability," filed Sep. 16, 2003, which is incorporated herein by reference in its entirety). Ideally, all attribute dependent failure modes should be corrected if possible; however, sometimes design constraints or a strong belief that a failure mode should be corrected by a process change rather than a design change can over-ride a decision to correct a failure mode.

Some design rule checking (DRC) tools and/or compaction tools may be used for the layout modifications in a limited fashion. Examples of such tools include DRACULA®, CALIBRE®, etc. As an example, if the via failure rate strongly depends on the border size, then such tools can be used to add borders around vias. This could either be across all vias or only across vias that have room to add borders without violating other design rules.

To summarize the post tape-out procedures, the yield models, together with the performance constraints, and the cost function for the optimization of the final yield are all considered in the design to maximize the flexibility and efficiency in computation for current ULSI post-tape out designs.

11. Determining Existing Failure Modes and Fail Rates

The use of a process chip to determine the fail rates of attributes using the processes depicted in FIGS. 3-8 and described above is novel compared to the conventional use of such process chips. Process test chips are usually designed to develop a process technology and to determine design rules. These process test chips typically include a Design of Experiments (DOE) that is solely driven by the process flow and to ensure a certain level of process quality.

In contrast to the use and design of conventional process test chips, a DOE of a test chip for determining existing failure models ("failure model test chips") (see also U.S. Pat. No. 6,449,749) is built from design attributes and possible design attribute modifications. Therefore the failure model test chips are more a function of layout issues rather than process issues. They typically explore all design layout layers, and as such are run through all process steps as a full flow vehicle, and/or a selected fraction of process steps as a short flow vehicle. The experiments are typically stacked on top of each other to most efficiently use a given chip area. The failure model test chips use special experiment addressing schemes to enable clear assignment of fail rates as well. The failure model test chips are not intended to drive process improvements but, rather, are intended to drive yield improvements due to layout modifications. These test chips explore and provide larger process windows for the design rules that can be used for such layout modifications. This can be significant, since it is now common practice to use functional design rules where, for instance, the minimum line width is a function of its space to its neighboring line(s). Such functional design rules provide significant latitude that may be useable for layout modification. The test chips using a DOE as described, are employed to evaluate the manufacturability of design rules and the design rule function to a much further extent than process driven DOEs. Manufacturability, as related to the design rules, includes but is not limited to: the systematic and random yield components, printability and reliability factors.

The use of the test chip described above that provides for the prediction of the resulting fail rates for a given IC design, is illustrated in FIG. 2. First, attributes from a product design layout are analyzed 202. Such attributes can be the number of vias, metal borders on top and below vias, etc. The particular attributes may be determined, for example, by what unique pattern can be identified within a design in a way that it can be assigned to a specific attribute. Design rule manuals are also often useful input for determining the attributes, since the design rules not only show the process limits, but also indicate which of the rules may be "difficult to manufacture." Design rule revisions are an especially good source for determining such "hard to manufacture" attributes. Once a set of attributes are identified, a test chip is designed 204 using representative attributes together with a Design of Experiments (DOE) methodology (see also U.S. Pat. No. 6,449,749).

A mask set is constructed from the test chip design 206, and the test chip is fabricated using the relevant manufacturing IC process facility, 208. At step 210 the fabricated test chip is tested, and the resulting data provides the random and systematic yield components related to the representative attributes. These results are used to populate related failure models 212. The failure rate models then provide the ability to predict the fail rates of the selected attributes 214.

Although exemplary embodiments have been described, various modifications can be made without departing from the spirit and/or scope of the present invention. Therefore, the present invention should not be construed as being limited to the specific forms shown in the drawings and described above.

We claim:

1. A method of designing an integrated circuit to improve yield when manufacturing the integrated circuit, the method comprising:

obtaining a design element from a set of design elements used in designing integrated circuits;

creating a variant design element based on the obtained design element, wherein a feature of the obtained design element is modified to create the variant design element;

determining a yield to area ratio for the variant design element;

if the yield to area ratio of the variant design element is greater than a yield to area ratio of the obtained design element, retaining the variant design element to be used in designing the integrated circuit, wherein the design element is a bit cell, the set of design elements is a set of bit cells, and the variant design element is a variant bit cell; and selecting a memory macro from a set of memory macros; and applying the variant bit cell to the selected memory macro.

2. The method of claim 1, wherein the variant bit cell is applied to each of the memory macros in order of size from smallest memory macro to largest memory macro.

3. The method of claim 2, wherein determining a yield to area ratio for the variant design element comprises:

computing a yield and a change in area using the variant bit cell, wherein the yield is computed based on one or more existing failure models.

4. The method of claim 3, wherein the one or more existing failure models are obtained by:

extracting attributes from a product design layout;

designing failure model test chips based on the extracted attributes and possible modifications of the extracted attributes;

manufacturing the designed failure model test chips; and testing and analyzing the manufactured failure model test chips to determine failures rates.

5. A method of designing an integrated circuit to improve yield when manufacturing the integrated circuit, the method comprising:

obtaining a design element from a set of design elements used in designing integrated circuits;

creating a variant design element based on the obtained design element, wherein a feature of the obtained design element is modified to create the variant design element;

determining a yield to area ratio for the variant design element;

if the yield to area ratio of the variant design element is greater than a yield to area ratio of the obtained design element, retaining the variant design element to be used in designing the integrated circuit, wherein the design element is a memory unit, the set of design elements is a set of memory units, and the variant design element is a redundancy unit; and sorting the memory units in the set of memory units in order of largest macro area to smallest macro area.

6. The method of claim 5, wherein determining a yield to area ratio for the variant design element comprises:

computing a yield and a change in area using the redundancy unit, wherein the yield is computed based on one or more existing failure models.

7. The method of claim 6, wherein the one or more existing failure models are obtained by:

extracting attributes from a product design layout;

designing failure model test chips based on the extracted attributes and possible modifications of the extracted attributes;

manufacturing the designed failure model test chips; and testing and analyzing the manufactured failure model test chips to determine failures rates.

8. The method of claim 5, wherein the variant design element includes a bit cell modification.

9. A method of designing an integrated circuit to improve yield when manufacturing the integrated circuit, the method comprising:

obtaining a design element from a set of design elements used in designing integrated circuits;

creating a variant design element based on the obtained design element, wherein a feature of the obtained design element is modified to create the variant design element;

determining a yield to area ratio for the variant design element;

if the yield to area ratio of the variant design element is greater than a yield to area ratio of the obtained design element, retaining the variant design element to be used in designing the integrated circuit, wherein the design element is an embedded memory unit, the set of design elements is a set of embedded memory units, and the variant design element is a memory type; and sorting the memory units in the set of memory units in order of largest macro area to smallest macro area.

10. The method of claim 9, wherein determining a yield to area ratio for the variant design element comprises:

computing a yield and a change in area using a different memory type, wherein the yield is computed based on one or more existing failure models.

11. The method of claim 10, wherein the one or more existing failure models are obtained by:

extracting attributes from a product design layout;

designing failure model test chips based on the extracted attributes and possible modifications of the extracted attributes;

manufacturing the designed failure model test chips; and testing and analyzing the manufactured failure model test chips to determine failures rates.

12. A method of designing an integrated circuit to improve yield when manufacturing the integrated circuit, the method comprising:

obtaining a design element from a set of design elements used in designing integrated circuits;

creating a variant design element based on the obtained design element, wherein a feature of the obtained design element is modified to create the variant design element;

determining a yield to area ratio for the variant design element;

if the yield to area ratio of the variant design element is greater than a yield to area ratio of the obtained design element, retaining the variant design element to be used in designing the integrated circuit, wherein the design element is a standard cell, the set of design elements is a library of standard cells, and the variant design element is a variant cell; and selecting one or more design modifications from a change list having a plurality of design modifications, wherein the feature of the standard is modified in accordance with the selected one or more design modifications.

13. The method of claim 12, further comprising:

compiling a usage listing of standard cells, wherein the usage listing is a pareto of the standard cells used most frequently in the design of the integrated circuit.

14. The method of claim 12, wherein the change list includes:

widening spacing between diffusions, polysilicon, or metal interconnections;

doubling contacts;

adding or widening borders on metal around contacts;

widening polysilicon interconnects; and changing silicide overlaps.

15. The method of claim 12, wherein the one or more design modifications are selected based on existing failure models.

16. The method of claim 15, wherein the one or more existing failure models are obtained by:
 extracting attributes from a product design layout;
 designing failure model test chips based on the extracted attributes and possible modifications of the extracted attributes;
 manufacturing the designed failure model test chips; and
 testing and analyzing the manufactured failure model test chips to determine failures rates.

17. The method of claim 12, further comprising:
 estimating an expected performance change for the variant cell; and
 if the expected performance change is unacceptable, discarding the variant cell.

18. The method of claim 12, wherein the yield to area ratio determined for the variant design element is based on a layout generated based on potential corrective modifications.

19. The method of claim 18, wherein the plurality of design modification in the change list includes:
 failure mechanisms and corresponding potential corrective modifications.

20. The method of claim 12, wherein a yield for the variant cell in an integrated circuit design is computed based on the number of occurrences of the variant cell in the integrated circuit design, and further comprising:
 raising the yield of the variant in the yield to area ratio of the variant cell to the power of the number of occurrence of the standard cell in the integrated circuit design; and
 raising the yield of the standard cell in the yield to area ratio of the standard cell to the power of the number of occurrence of the standard cell in the integrated circuit design.

21. The method of claim 12, further comprising:
 identifying standard cells in the library to be modified using a selection criterion.

22. The method of claim 21, wherein the selection criterion is a measure or an estimate of maximum overall impact that modifications on a standard cell will have on the number of good dies per wafer (GDW) for a target product.

23. The method of claim 22, further comprising:
 determining the GDW for the integrated circuit using the standard cells;
 multiplying a resulting chip yield by the number of dies per wafer;
 determining a different GDW for the integrated circuit that incorporates the variant cells;
 multiplying the resulting chip yield by the number of die in a wafer;
 determining a maximum increment of GDW for each standard cell by subtracting the difference of the GDW given by using the variant cell and the standard cell; and
 sorting the standard cells by the maximum increment of GDW.

24. The method of claim 22, wherein the selection criterion includes:
 a minimum increment GDW desired in the product;
 a maximum number of standard cells to be modified; and
 an incremental increase in GDW from modifying an additional standard cell.

25. A method of designing an integrated circuit to improve yield when manufacturing the integrated circuit, the method comprising:
 obtaining a design element from a set of design elements used in designing integrated circuits;
 creating a variant design element based on the obtained design element, wherein a feature of the obtained design element is modified to create the variant design element;
 determining a yield to area ratio for the variant design element; and
 if the yield to area ratio of the variant design element is greater than a yield to area ratio of the obtained design element, retaining the variant design element to be used in designing the integrated circuit, wherein the design element is a gate-level net-list, the set of design elements is a set of gate-level net-lists, and the variant design element is a variant gate-level net-list, and wherein a feature of the obtained gate-level net-list is modified by:
 changing a router/placer configuration file; or
 changing router/placer/options switches.

26. The method of claim 12, further comprising:
 selecting a set of figure of merit (FOM) circuits representative of types of designs to be implemented;
 estimating a parametric yield of the FOM circuits using standard response surface methodology flows; and
 determining a range or a set of values that make the FOM circuits achieve a desired parameter yield using yield impact graphs, wherein a yield impact graph plots a parametric yield as a function of process parameter distribution.

27. The method of claim 26, further comprising:
 determining an estimate of robustness of a standard cell using a yield impact graph for the standard cell.

28. The method of claim 27, wherein the variant cell has a different performance, parametric yield, or robustness than the standard cell.

29. The method of claim 26, wherein a yield impact graph plot is generated by:
 selecting a number of intervals for a mean of a set of electrical and physical parameters ($m_i$); and
 running a simulation using a probabilistic model involving an element of chance on a space of means and standard deviations of uncorrelated parameters until:
 a) for each interval of the mean of $m_i$, at least one distribution has a mean within the interval and a standard deviation less than a predetermined fraction of a standard deviation of $m_i$ from a reference standard deviation of $m_i$; and
 b) for each interval of the standard deviation of $m_i$, at least one distribution has a standard deviation within the interval and a mean less than a predetermined fraction of the mean of $m_i$ from the reference mean of $m_i$.

30. The method of claim 29, wherein for each distribution that meets a),
 running a simulation using a probabilistic model involving an element of chance, wherein at each interval a timing variable is computed and compared with timing specifications, wherein a minimum and maximum value of the timing variable is a model value of a minimum and maximum delay as a function of the means value of one $m_i$ corresponding to a center of the interval of the mean of $m_i$, and wherein a ratio between the number of samples that meet a) and the total number of samples is a yield value of a speed-limited yield as a function of the mean value of one $m_i$.

31. The method of claim 29, wherein for each distribution that meets b),
 running a simulation using a probabilistic model involving an element of chance, wherein at each interval a timing variable is computed and compared with timing specifications, wherein a minimum and maximum value of the timing variable is a model value of a minimum and maximum delay as a function of the standard deviation of one $m_i$ corresponding to a center of the interval of the standard deviation of $m_i$, and wherein a ratio between the number of samples that meet b) and the total number of samples is a yield value of a speed-limited yield as a function of the standard deviation of one $m_i$.

32. The method of claim 29, wherein the simulation using a probabilistic model involving an element of chance is a Monte Carlo experiment, and wherein the predetermined fraction is 10 percent.

33. A method of designing an integrated circuit to improve yield when manufacturing the integrated circuit, the method comprising:
obtaining a design element from a set of design elements used in designing integrated circuits;
creating a variant design element based on the obtained design element, wherein a feature of the obtained design element is modified to create the variant design element;
determining a yield to area ratio for the variant design element;
if the yield to area ratio of the variant design element is greater than a yield to area ratio of the obtained design element, retaining the variant design element to be used in designing the integrated circuit; and
determining post tape-out modifications, wherein determining post tape-out modifications comprises:
determining existing failures models;
determining modifications of layout attributes;
determining yield impact of the determined modifications;
generating a modified layout using the determined modifications;
predicting yield of the modified layout; and
verifying the modified layout.

34. The method of claim 33, wherein determining existing failure models comprises:
extracting attributes from a product design layout;
designing failure model test chips based on the extracted attributes and possible modifications of the extracted attributes;
manufacturing the designed failure model test chips; and
testing and analyzing the manufactured failure model test chips to determine failures rates.

35. A system for designing an integrated circuit to improve yield when manufacturing the integrated circuit, the system comprising:
a design element obtained from a set of design elements used in designing integrated circuits;
a variant design element created based on the obtained design element, wherein a feature of the obtained design element is modified to create the variant design element;
a processor configured to:
determine a yield to area ratio for the variant design element, and
if the yield to area ratio of the variant design element is greater than a yield to area ratio of the obtained design element, retain the variant design element to be used in designing the integrated circuit; and
one or more existing failure models, wherein the one or more existing failure models are obtained by:
extracting attributes from a product design layout;
designing failure model test chips based on the extracted attributes and possible modifications of the extracted attributes;
manufacturing the designed failure model test chips; and
testing and analyzing the manufactured failure model test chips to determine failures rates.

36. The system of claim 35, wherein the design element is a bit cell, the set of design elements is a set of bit cells, and the variant design element is a variant bit cell, and further comprising:
a selector configured to:
select a memory macro from a set of memory macros, and
apply the variant bit cell to the selected memory macro, wherein the variant bit cell is applied to each of the memory macros in order of size from smallest memory macro to largest memory macro.

37. The system of claim 36, wherein the yield to area ratio for the variant design element is determined by:
computing a yield and a change in area using the variant bit cell, wherein the yield is computed based on the one or more existing failure models.

38. The system of claim 35, wherein the design element is a memory unit, the set of design elements is a set of memory units, and the variant design element is a redundancy unit, and wherein the memory units in the set of memory units are sorted in order of largest macro area to smallest macro area.

39. The system of claim 38, wherein the yield to area ratio for the variant design element is determined by:
computing a yield and a change in area using the redundancy unit, wherein the yield is computed based on the one or more existing failure models.

40. The system of claim 38, wherein the variant design element includes a bit cell modification.

41. The system of claim 35, wherein the design element is an embedded memory unit, the set of design elements is a set of embedded memory units, and the variant design element is a memory type, and wherein the memory units in the set of memory units are sorted in order of largest macro area to smallest macro area.

42. The system of claim 41, wherein the yield to area ratio for the variant design element is determined by:
computing a yield and a change in area using a different memory type, wherein the yield is computed based the on one or more existing failure models.

43. The system of claim 35, wherein the design element is a standard cell, the set of design elements is a library of standard cells, and the variant design element is a variant cell, and further comprising:
a change list having a plurality of design modifications, wherein the feature of the standard is modified in accordance with the selected one or more design modifications.

44. The system of claim 43, further comprising:
a usage listing of standard cells, wherein the usage listing is a pareto of the standard cells used most frequently in the design of the integrated circuit.

45. The system of claim 44, wherein the change list includes:
widening spacing between diffusions, polysilicon, or metal interconnections;
doubling contacts;
adding or widening borders on metal around contacts;
widening polysilicon interconnects; and
changing silicide overlaps.

46. The system of claim 43, further comprising:
a selector configured to select one or more design modifications from the change list, wherein the one or more design modifications are selected based on the existing failure models.

47. The system of claim 43, wherein the processor is further configured to:
estimate an expected performance change for the variant cell; and
if the expected performance change is unacceptable, discard the variant cell.

48. The system of claim 43, wherein the yield to area ratio determined for the variant design element is based on a layout generated based on potential corrective modifications.

49. The system of 48, wherein the plurality of design modification in the change list includes:
   failure mechanisms and corresponding potential corrective modifications.

50. The system of claim 43, wherein a yield for the variant cell in an integrated circuit design is computed based on the number of occurrences of the variant cell in the integrated circuit design, wherein the yield of the variant in the yield to area ratio of the variant cell is raised to the power of the number of occurrence of the standard cell in the integrated circuit design, and wherein the yield of the standard cell in the yield to area ratio of the standard cell is raised to the power of the number of occurrence of the standard cell in the integrated circuit design.

51. The system of claim 43, further comprising:
   a selector configured to identify standard cells in the library to be modified using a selection criterion, wherein the selection criterion is a measure or an estimate of maximum overall impact that modifications on a standard cell will have on the number of good dies per wafer (GDW) for a target product.

52. The system of claim 51, wherein:
   the GDW for the integrated circuit is determined using the standard cells;
   a resulting chip yield is multiplied by the number of dies per wafer;
   a different GDW for the integrated circuit is determined that incorporates the variant cells;
   the resulting chip yield is multiplied by the number of die in a wafer;
   a maximum increment of GDW for each standard cell is determined by subtracting the difference of the GDW given by using the variant cell and the standard cell; and
   the standard cells are sorted by the maximum increment of GDW.

53. The system of claim 51, wherein the selection criterion includes:
   a minimum increment GDW desired in the product;
   a maximum number of standard cells to be modified; and
   an incremental increase in GDW from modifying an additional standard cell.

54. The system of claim 35, wherein the design element is a gate-level net-list, the set of design elements is a set of gate-level net-lists, and the variant design element is a variant gate-level net-list, and wherein a feature of the obtained gate-level net-list is modified by:
   changing a router/placer configuration file; or
   changing router/placer/options switches.

55. The system of claim 43, further comprising:
   a set of figure of merit (FOM) circuits representative of types of designs to be implemented, wherein a parametric yield of the FOM circuits is estimated using standard response surface methodology flows, and wherein a range or a set of values is determined that make the FOM circuits achieve a desired parameter yield using yield impact graphs, and wherein a yield impact graph plots a parametric yield as a function of process parameter distribution.

56. The system of claim 55, further comprising:
   a yield impact graph for a standard cell, wherein an estimate of robustness of the standard cell is determined using the yield impact graph.

57. The system of claim 56, wherein the variant cell has a different performance, parametric yield, or robustness than the standard cell.

58. The system of claim 55, wherein a yield impact graph plot is generated by:
   selecting a number of intervals for a mean of a set of electrical and physical parameters ($m_i$); and
   running a simulation using a probabilistic model involving an element of chance on a space of means and standard deviations of uncorrelated parameters until:
   a) for each interval of the mean of $m_i$, at least one distribution has a mean within the interval and a standard deviation less than a predetermined fraction of a standard deviation of $m_i$ from a reference standard deviation of $m_i$; and
   b) for each interval of the standard deviation of $m_i$, at least one distribution has a standard deviation within the interval and a mean less than a predetermined fraction of the mean of $m_i$ from the reference mean of $m_i$.

59. The system of claim 58, wherein for each distribution that meets a),
   running a simulation using a probabilistic model involving an element of chance, wherein at each interval a timing variable is computed and compared with timing specifications, wherein a minimum and maximum value of the timing variable is a model value of a minimum and maximum delay as a function of the means value of one $m_i$ corresponding to a center of the interval of the mean of $m_i$, and wherein a ratio between the number of samples that meet a) and the total number of samples is a yield value of a speed-limited yield as a function of the mean value of one $m_i$.

60. The system of claim 58, wherein for each distribution that meets b),
   running a simulation using a probabilistic model involving an element of chance, wherein at each interval a timing variable is computed and compared with timing specifications, wherein a minimum and maximum value of the timing variable is a model value of a minimum and maximum delay as a function of the standard deviation of one $m_i$ corresponding to a center of the interval of the standard deviation of $m_i$, and wherein a ratio between the number of samples that meet b) and the total number of samples is a yield value of a speed-limited yield as a function of the standard deviation of one $m_i$.

61. The system of claim 58, wherein the simulation using a probabilistic model involving an element of chance is a Monte Carlo experiment, and wherein the predetermined fraction is 10 percent.

62. The system of claim 35, wherein the processor is further configured to determine post tape-out modifications.

63. The system of claim 62, wherein post tape-out modifications are determined by:
   determining modifications of layout attributes;
   determining yield impact of the determined modifications;
   generating a modified layout using the determined modifications;
   predicting yield of the modified layout; and
   verifying the modified layout.

64. A computer readable storage medium containing computer executable instructions for causing a computer to aid in the design of an integrated circuit to improve yield when manufacturing the integrated circuit, comprising instructions for:
   obtaining a design element from a set of design elements used in designing integrated circuits;

creating a variant design element based on the obtained design element, wherein a feature of the obtained design element is modified to create the variant design element;

determining a yield to area ratio for the variant design element, wherein the area in the yield to area ratio corresponds to the area of the entire variant design element;

if the yield to area ratio of the variant design element is greater than a yield to area ratio of the obtained design element, retaining the variant design element to be used in designing the integrated circuit, wherein the design element is a standard cell, the set of design elements is a library of standard cells, and the variant design element is a variant cell; and selecting one or more design modifications from a change list having a plurality of design modifications, wherein the feature of the standard is modified in accordance with the selected one or more design modifications.

* * * * *